(12) United States Patent
Jun et al.

(10) Patent No.: US 6,551,937 B2
(45) Date of Patent: Apr. 22, 2003

(54) PROCESS FOR DEVICE USING PARTIAL SOI

(75) Inventors: Cai Jun, Portland, ME (US); Ren Chang Hong, Singapore (SG); Ranganathan Nagarajan, Singapore (SG); Narayanan Balasubramanian, Singapore (SG); Yung Chii Liang, Singapore (SG)

(73) Assignees: Institute of Microelectronics, Singapore (SG); National University of Singapore, Singapore (SG)

( * ) Notice: Subject to any disclaimer, the term of this patent is extended or adjusted under 35 U.S.C. 154(b) by 77 days.

(21) Appl. No.: 09/938,042

(22) Filed: Aug. 23, 2001

(65) Prior Publication Data

US 2003/0040185 A1 Feb. 27, 2003

(51) Int. Cl.[7] ............................................. H01L 21/311
(52) U.S. Cl. ....................................... 438/694; 438/720
(58) Field of Search ................................. 438/404, 405, 438/407, 410, 694, 696, 720

(56) References Cited

U.S. PATENT DOCUMENTS

| | | | |
|---|---|---|---|
| 5,338,965 A | | 8/1994 | Malhi ........................ 257/492 |
| 5,378,912 A | | 1/1995 | Pein ........................... 257/335 |
| 5,382,818 A | | 1/1995 | Pein ........................... 257/347 |
| 5,429,955 A | * | 7/1995 | Joyner et al. ............... 438/766 |
| 5,777,365 A | | 7/1998 | Yamaguchi et al. ......... 257/347 |
| 5,907,783 A | * | 5/1999 | Kim et al. ................... 438/407 |
| 6,222,234 B1 | * | 4/2001 | Imai ............................ 257/347 |
| 6,238,998 B1 | * | 5/2001 | Leobandung ............... 438/404 |
| 6,265,248 B1 | * | 7/2001 | Darmawan et al. ......... 438/155 |
| 6,465,313 B1 | * | 10/2002 | Yu et al. ..................... 438/300 |

OTHER PUBLICATIONS

"Application of Partially Bonded SOI Structure to an Intelligent Power Device Having Vertical DMOSFET," Kobayashi et al., IEEE ISPSD '97, pp. 309–312.

"Modelling of self–heating effect in thin SOI and Partial SOI LDMOS power devices," H.T. Lim et al., Solid–State Electronics 43 (1999), pp. 1267–1280.

* cited by examiner

*Primary Examiner*—Kin-Chan Chen
(74) *Attorney, Agent, or Firm*—George O. Saile; Stephen B. Ackerman (57) ABSTRACT

A process for manufacturing a buried oxide layer for use in partial SOI structures is described. The process begins with the etching of deep trenches into a silicon body. For a preselected depth below the surface, the inner walls of the trenches are protected and oxidation of said walls is then effected until pinch-off occurs, both inside the trenches and in the material between trenches. The result is a continuous layer of wade whose size and shape are determined by the number and location of the trenches. Application of the process to the manufacture of a partial SOI RFLDMOS structure is also described together with performance data for the resulting device.

21 Claims, 7 Drawing Sheets

PROCESS FOR DEVICE USING PARTIAL SOI

FIELD OF THE INVENTION

The invention relates to the general field of power devices with particular reference to RFLDMOS devices fabricated by standard LDMOS processes and its application in Radio-Frequency (RF) ICs.

BACKGROUND OF THE INVENTION

High frequency power devices are increasingly needed as an indispensable part in modem personal communication service systems. LDMOSFETs are the only suitable devices on silicon substrates for such applications, the desirable characteristics being high frequency performance, high transconductance, and high blocking voltage. Now the focus is on faster chips that also require less power—a key requirement for extending the battery life of small, hand-held power devices that will be pervasive in the future. Relatively higher parasitic capacitance and high leakage will limit the achievable application frequency and power dissipation of RF LDMOSFET.

When an FET device is required to operate at high power, means must be found for dissipating the generated heat. To accomplish this, the design illustrated in FIG. 1a has been widely adopted in the industry. In this design, connection to the source is made though lower area 11 which occupies the entire bottom of the device, where it can be directly connected to a heat sink Lower area 11 is connected to source 10 through sinker 12. Both 11 and 12 are of P+ silicon because P− region 14 needs to be grounded and metallic shorting bar 15 is provided in order to connect 10 to 12. The remainder of the device is of a standard nature. Gate 16 controls the current flow in the body of the device, across channel region 13, into the drain which is made up of an inner, lightly doped section 18 and an outer, heavily doped section 17.

Figure 1A:
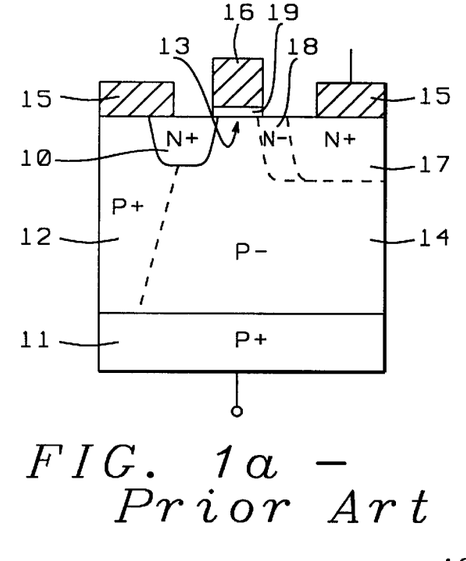
FIG. 1a shows a conventional FET power device.

Unfortunately, $C_{ds}$, the source-to-drain capacitance, is large in designs of the type shown in FIG. 1a because of the relatively thin depletion layer that forms at the N+/P− interface. One approach that has been used to overcome this problem has been the design illustrated in FIG. 1b. Here, dielectric layer 33 is inserted between the source, drain and channel regions 10, 17/18, and 14, respectively. This ensures that the magnitude of $C_{ds}$ will be determined by the thickness of 33 rather than by any depletion layers.

Figure 1B:
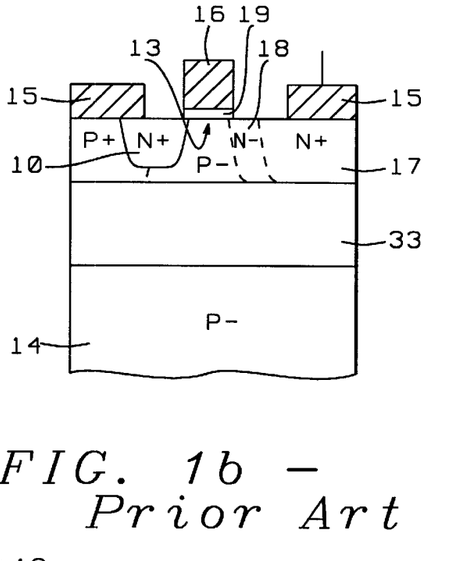
FIG. 1b shows an FET device modified to include full SOI isolation.

The SOI (silicon on insulator) structure shown in FIG. 1b produces devices with smaller junction area, simple Isolation structure, and steeper subthreshold-voltage slopes the bulk devices. Performance dearly profits from the consequent reduction in parasitic capacitance and leakage current, which is appropriate for high frequency and low power dissipation applications. However, at the same time, this SOI structure also has many other drawbacks, such as floating-body effect and low thermal dissipation capability. A quasi-SOI power MOSFET fabricated by reverse silicon wafer direct bonding was recently reported (Satoshi Matsumoto, et al., IEEE Transactions on Electron Devices, vol. 45, no.9, September(1998)1940–1946) to suppress the short channel effect and parasitic bipolar action. However, the device is still with the floating-body effect. Also, the fabrication process was very complicated and difficult to make compatible with standard IC process. Thus, the fabrication of such a device implies a high manufacturing cost.

A routine search of the prior art was performed with the following references of interest being found:

"Application of partially bonded SOI structure to an intelligent power device having vertical DMOSFET"—IEEE ISPSD'97 p309–312 and "Modeling of self-heating effect in thin SOI and partial SOI LDMOS power devices"—Solid-State Electronics 43 (1999)1267–1280.

Additionally, in U.S. Pat. No. 5,338,965, Malhi shows a "partial SOI" LDMOS with oxide under the channel, drain and source. Pein (U.S. Pat. No. 5,382,818) and Pein (U.S. Pat. No. 5,378,912) both show various LDMOS devices with different oxide layer configurations. In U.S. Pat. No. 5,777,365, Yamaguchi et al. disclose an LDMOS transistor formed overlying a buried oxide layer for good electrical isolation while Malhi, in U.S. Pat. No. 5,338,965, teaches a SOI MOS combined with RESURF LDMOS.

SUMMARY OF THE INVENTION

It has been an object of at least one embodiment of the present invention to provide a semiconductor device having low parasitic capacitance while being capable of operating at relatively high power levels.

Another object of at least one embodiment of the present invention has bean to provide a process for the formation of a buried layer of oxide, of any shape, any size, any thickness, and at any depth.

These objects have been achieved by etching deep trenches into a silicon body. For a preselected depth below the surface, the inner walls of the trenches are protected and oxidation of said walls is then effected until pincer occurs, both inside the trenches and in the material between trenches. The result is a continuous layer of oxide whose size and shape are determined by the number and location of the trenches. Application of the process to the manufacture of a partial SOI RFLDMOS device is also described together with performance data for the resulting structure. The buried oxide layer is inserted only under the LDD and the drain regions, on top of which fabrication processes of the RF LDMOSFET proceed as usual. This structure keeps the same benefits of low parasitic capacitance, low leakage, steeper sub-threshold slope, and good isolation properties as SOI device does. At the same time, the device is "bulk-like" and can overcome the drawbacks of full SOI devices, such as floating-body effect and poor thermal dissipation properties.

DESCRIPTION OF THE PREFERRED EMBODIMENTS

Figure 2:
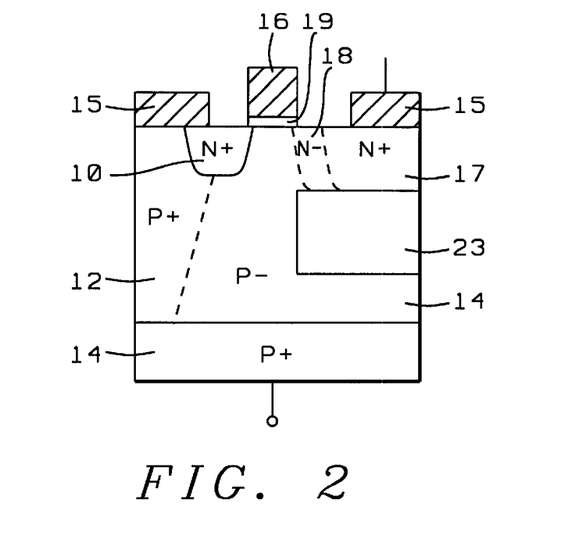
FIG. 2 shows an FET device modified to include partial SOI isolation.

The present invention solves the problem of having both high frequency performance and good power handling capability by taking a partial SOI approach to FIG. 2 we show an example of an LDMOS device having partial SOI. As can be seen, it is similar to the device shown in FIG. 1a except dielectric layer 23 has been inserted between the drain region and the body of the device 18. Unlike the prior art device of FIG. 1b, layer 23 underlies only the outer (N+) section 17 of the drain as well as just a small part of the inner (N−) section 16.

The partial SOI idea is a universal concept and several methods have been proposed for implementing partial SOI technology and partial SOI devices. Different partial SOI devices are based on different partial SOI technology. Most of these partial SOI technologies are very complicated and/or difficult to blend with standard CMOS processes. The key points for these structures ace to put an oxide layer under different junction areas, but each uses a different partial SOI technology.

Our partial SOI process is based on direct thermal oxide pinch-off. The oxide thickness is not limited by normal thermal oxidation constraints and can be from a few microns to tens of microns thick. The partial SOI substrate can be selectively located in any area of a device, including active areas, to reduce parasitic capacitance for high frequency performance and also cart be used to reduce the substrate losses of passive components, for example, under an inductor or transmission line when there is a high Q value requirement. Thus, the present invention has the flexibility to place a SOI substrate anywhere it may be needed, without affecting other areas of bulk silicon, and, additionally, this technology is fully compatible with standard CMOS processes.

We will describe the process of the present invention in terms of the formation of a RFLDMOS FET but it will be understood that the process is of a general nature and may be employed wherever there is need for a buried layer of insulation of limited area.

Figure 3:
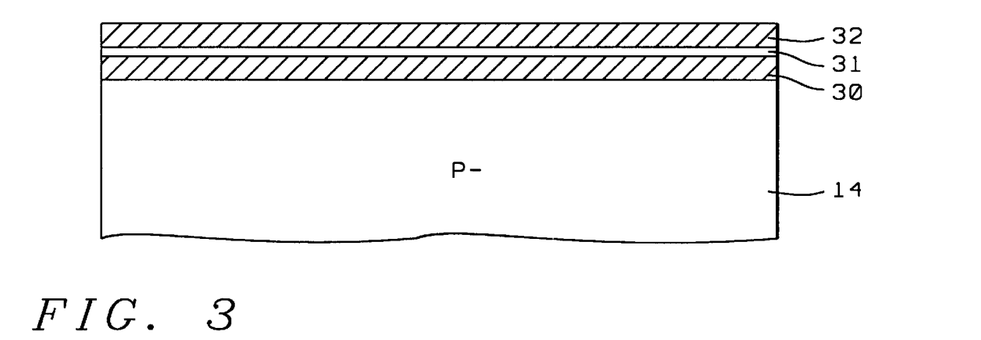
FIG. 3 is the starting point for the process of the present invention.

We begin our description by referring to FIG. 3 which shows the structure of FIG. 2 in its early stages, namely after P− silicon layer 14 has been epitaxially deposited onto P+ silicon substrate 11 (not inducted in FIG. 3). Silicon oxide layer 30 (thickness between about 0.3 and 0.7 microns) is then formed on the surface of layer 14 followed by the deposition thereon of silicon nitride layer 31 to a thickness between about 0.1 and 0.2 microns. Then second layer of silicon oxide 32 is deposited onto layer 31. Layer 32 is between about 0.3 and 0.7 microns thick and is formed from LPCVD (low pressure chemical vapor deposition) of tetra-ethylorthosilicate (TEOX).

Figure 4:
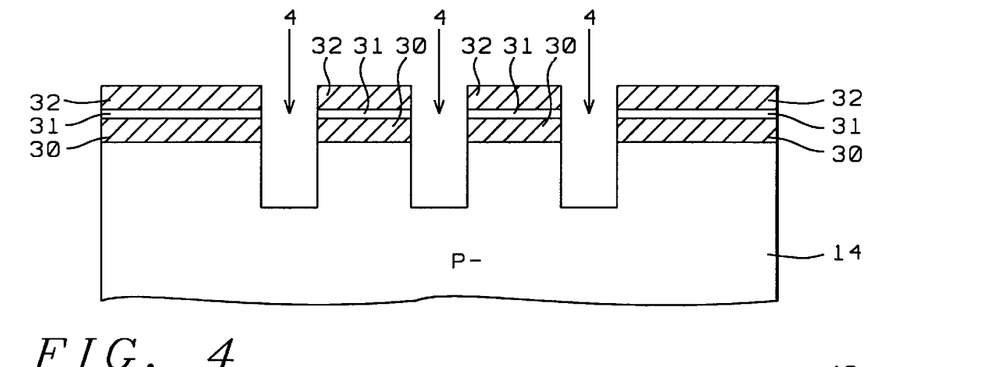
FIGS. 4–7 illustrate steps in the formation of deep trenches whose inner walls are protected near the trenches' mouths.

After suitable photolithographic patterning, layer 32 becomes a hard mask shaped to define a set of trenches 4, as seen in FIG. 4. Each trench has a width between about 0.3 and 1.5 microns and could be located anywhere on the wafer surface but, for the specific case of the LDMOS device, they extend inwards from one side (away from the right edge in the current example). Trench depth at this stage was between about 0.3 and 1.5 microns.

Note that the width of the trenches and the distance between trenches cannot be varied independently. If, for a given width, the trenches are too far apart then pinch-off will occur inside the trenches first and not all silicon between trenches will get oxidized. Conversely, if the trenches are too dose together pinch-off will occur first within the silicon body and the trenches will not become completely filled with oxide. We have determined that pinch-off can be made to occur simultaneously in both regions if the trench separation distance is about 1.1 times the trench width.

Figure 5:
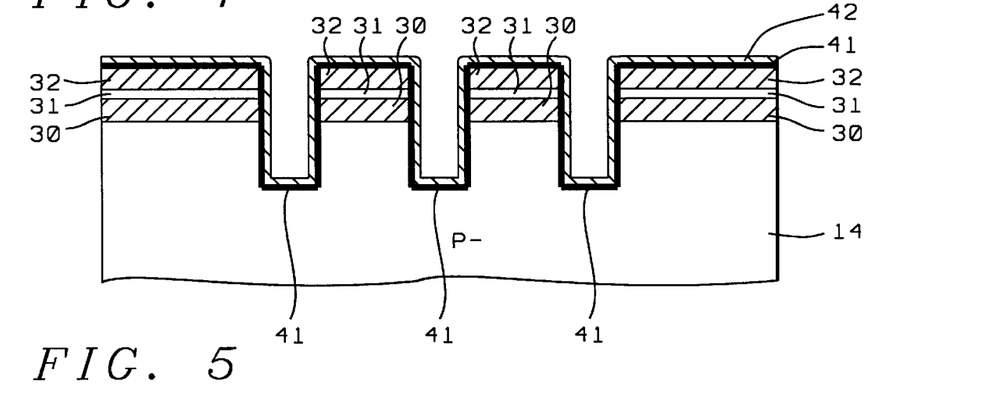
Figure 6:
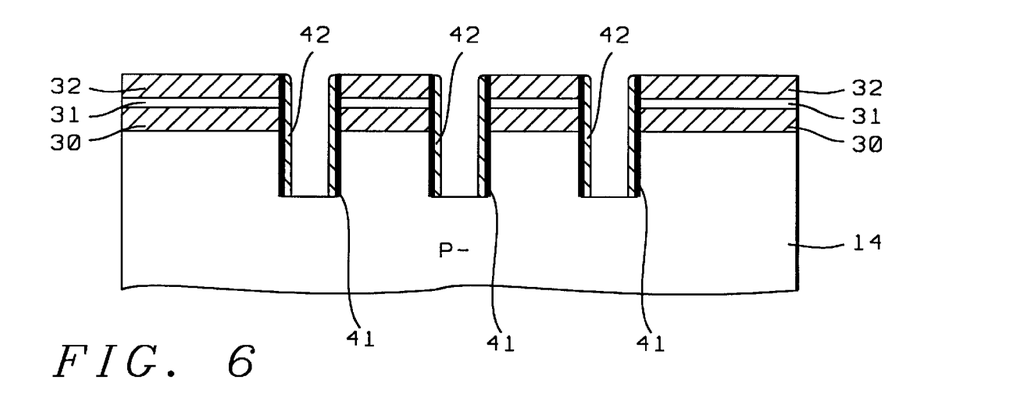
Figure 7:
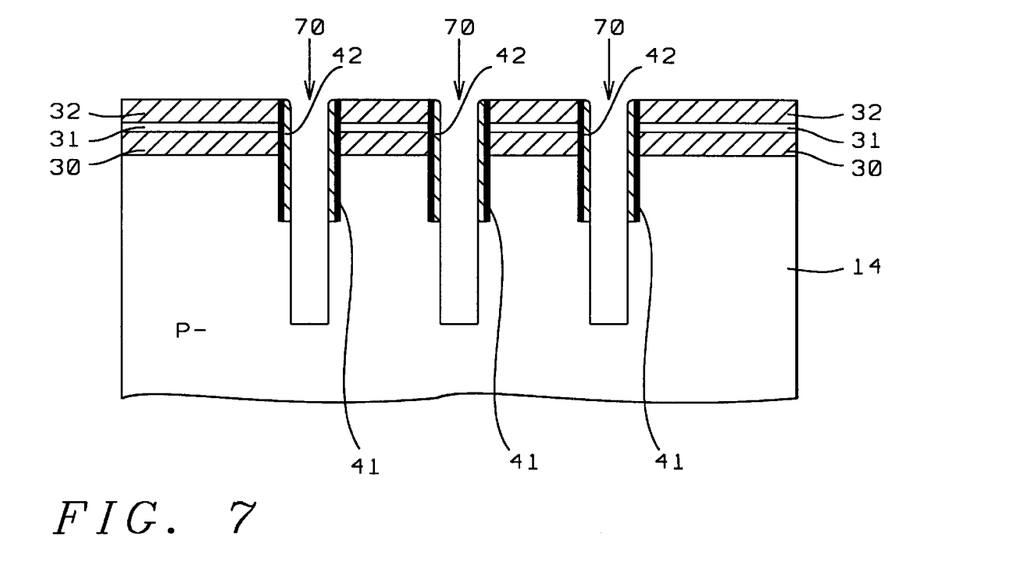

Referring first to FIG. 5, two-layer laminate 41/42 (silicon oxide layer 42 on (silicon nitride layer 41) is deposited on all an surfaces, following which laminate 49/42 is selectively removed from all horizontal surfaces (see FIG. 6). Layer 42 is between about 0.01 and 0.02 microns thick while layer 41 is between about 0.01 and 0.03 microns thick, for a total laminate thickness between about 0.02 and 0.05 microns Then, using layers 30–32 and 41/42 as a hard mask, trench etching is resumed so that deeper trenches 70 result, as shown in FIG. 7. For etching the second portion of the trenches we have used a mix of $C_4F_8$ and $SF_6$ in an inductive coupled (ICP) RIE (Reactive Ion Etching) system. Typical operating conditions were: pressure 15 mtorr; ICP coil power 800 W; bias power 15 W; $C_4F_8$ flow rate 90 SCCM; $SF_6$ flow rate 40 SCCM. This resulted in an etch rate of about 0.3–0.4 microns/minute. During etching the nitride spacer is also attacked, but more slowly, its etch rate being about 10–15 times slower than for the oxide and about 15–20 times slower than for the resist.

The additional depth that has been added is between about 0.5 and 15 microns. A key feature of the deeper trenches is that the sidewalls at the top (where the initial trenches were) retains its protective two layer laminate 41/42.

Figure 8:
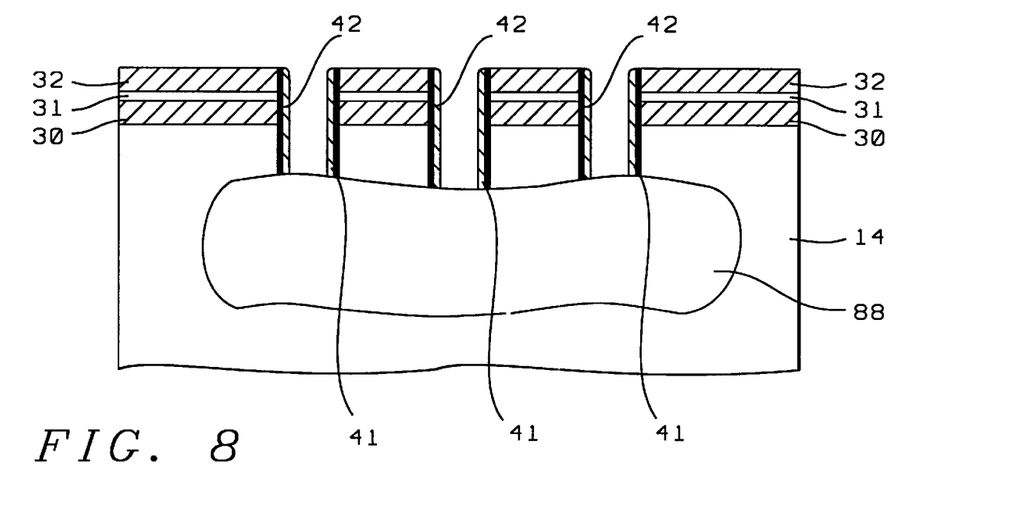
FIG. 8 shows how pinch-off oxidation is used to create a thick continuous layer of buried oxide.

Referring now to FIG. 8, all exposed silicon surfaces are now thermally oxidized. Oxide then grows both inwards and outwards away from the sidewalls of the second trench set oxidation being continued until the newly formed oxide layers meet and are pinched off, both inside the trenches and inside the surrounding material. The result is continuous silicon oxide layer 88 whose upper surface is parallel to the top surface of silicon 14, whose thickness is between about 0.5 and 16 microns, and whose location has been determined by the placement of the original trenches 4.

Figure 9:
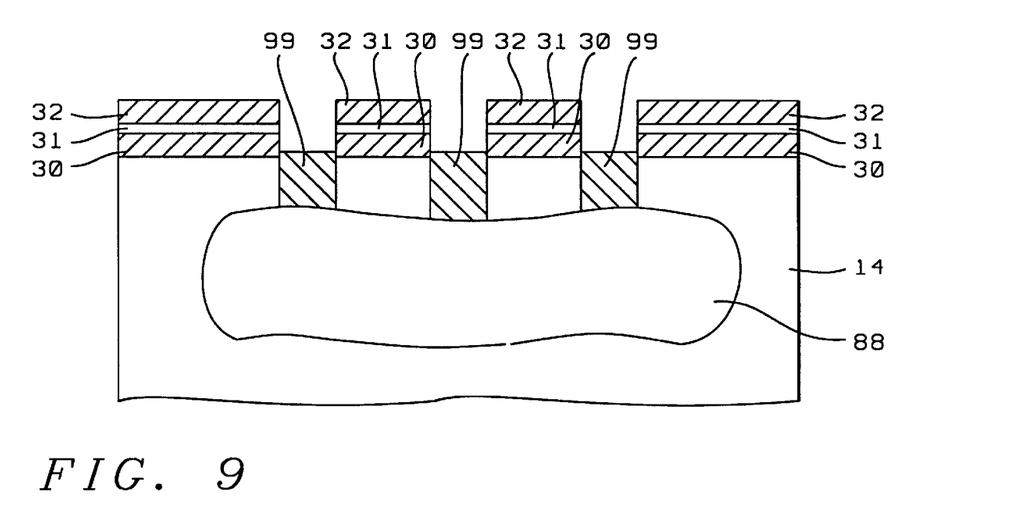
FIGS. 9–10 illustrate completion of the structure by filling trenches with polysilicon.
Figure 10:
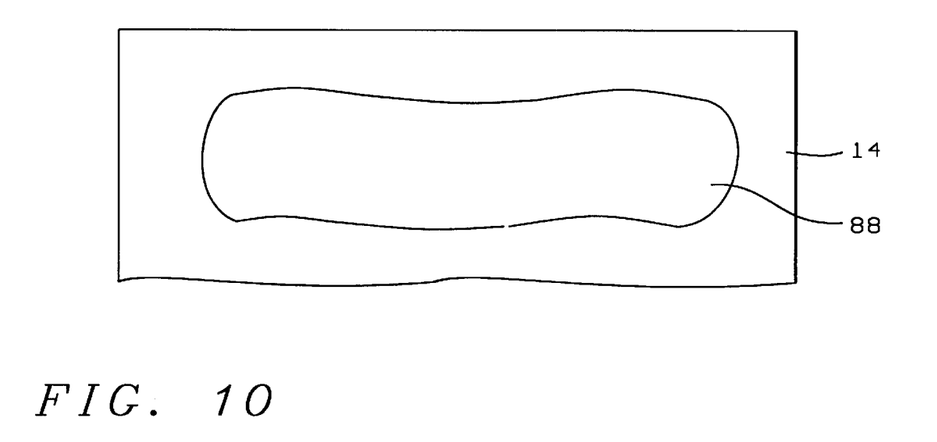

Next, as seen in FIG. 9, two layer laminate 41/42 is removed so that the original trenches 4 are restored. These are then overfilled with polysilicon 99, following which a planarizing etch, with overetching, is used to remove all excess polysilicon above the surface of silicon 14. For the planarizing etch we have used RIE etch-back. Hard mask 30–32 is then removed giving the structure the appearance shown in FIG. 10 where polysilicon regions 99 are no longer shown as being distinct from any other silicon regions of body 14.

To complete formation of the LDMOS device, the standard manufacturing process is resumed, A sinker 12 (see FIG. 2) of P+ silicon that extends away from the left edge (in this example) is formed. Then, layer of N− silicon 18 is formed as shown in FIG. 2 following which the N+ areas 10 and 17 get formed, in the locations shown, through a mask. Layer of gate oxide 19 is formed over the gap 13 (between 10 and 18 i.e. the channel area) with gate electrode 16 being formed above it. Metallic contacts 15 to 10 and 17 are then formed and the process is complete. If the above-described process is implemented as we have described, the resulting field effect transistor will have a cutoff frequency greater than about 10 Ghz. Additionally, its thermal dissipation capability will be such that it can operate at a power level between about 0.5 and 60 watts.

RESULTS (a) Parasitic capacitance and leakage

Figure 11:
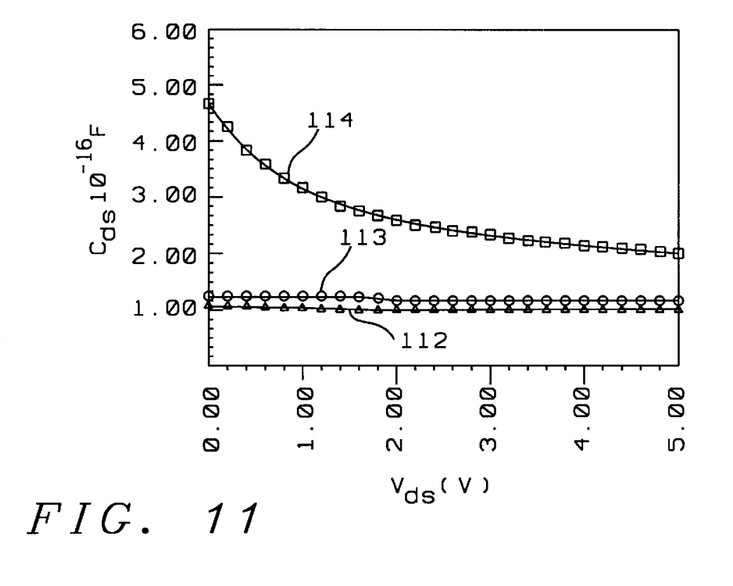
FIGS. 11–14 compare various performance characteristics of a partial SOI structure, formed according to the process of the present invention, to conventional and/or full SOI structures.
Figure 12:
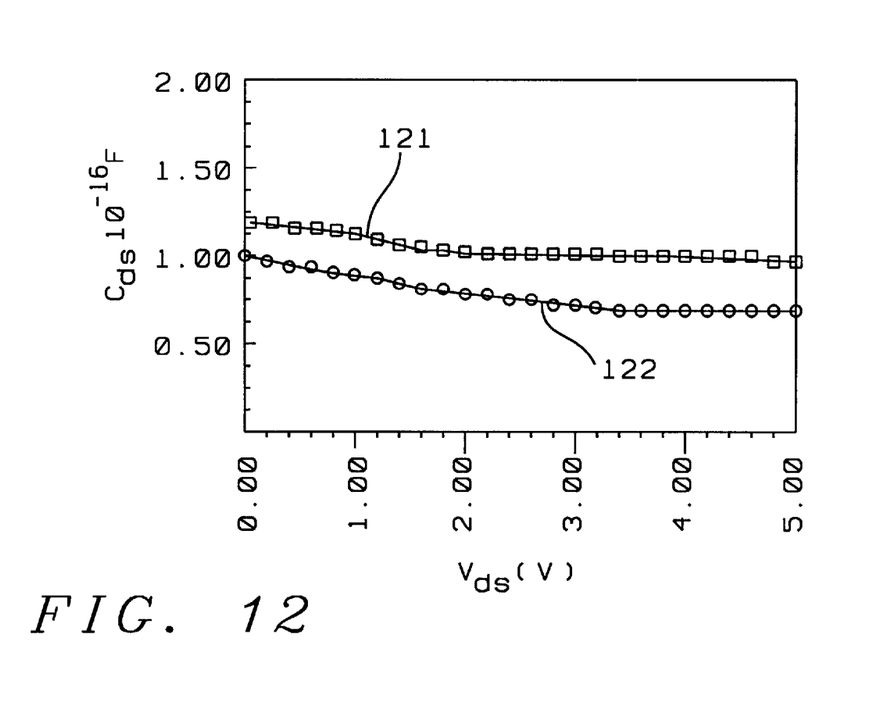

FIG. 11 compares simulated C-V plots for bulk, SOI and partial SOI devices as a function of drain bias. The thickness of the buried oxide layer was 1.0 micron for the partial SOI and full SOI devices. As seen from the plots, Cds in the conventional bulk structure at zero bias is 4.7 pf/cm (curve 114), compared to 1.37 pf/cm in the partial SOI structure (curve 113), a decease of 70%, and is almost the same as that of the full SOI structure (curve 112). More important, the flat Cds curve is easy to match and so facilitates RF It is much easier to get a thicker oxide layer for the partial SOI device, than it is for conventional full SOI technology. FIG. 12 is a comparison of the simulated C-V plots for SOI and partial SOI devices for different buried oxide thickness. The thickness of the buried oxide was 3.0 micron for partial SOI (curve 122) and 1.0 micron for full SOI devices (curve 121). At a source-drain voltage of 3.6 V, the drain to source capacitance in the full SOI structure is 1.02 pF/cm, while it is only 0.65 pF/cm in the partial SOI structure.

Figure 13:
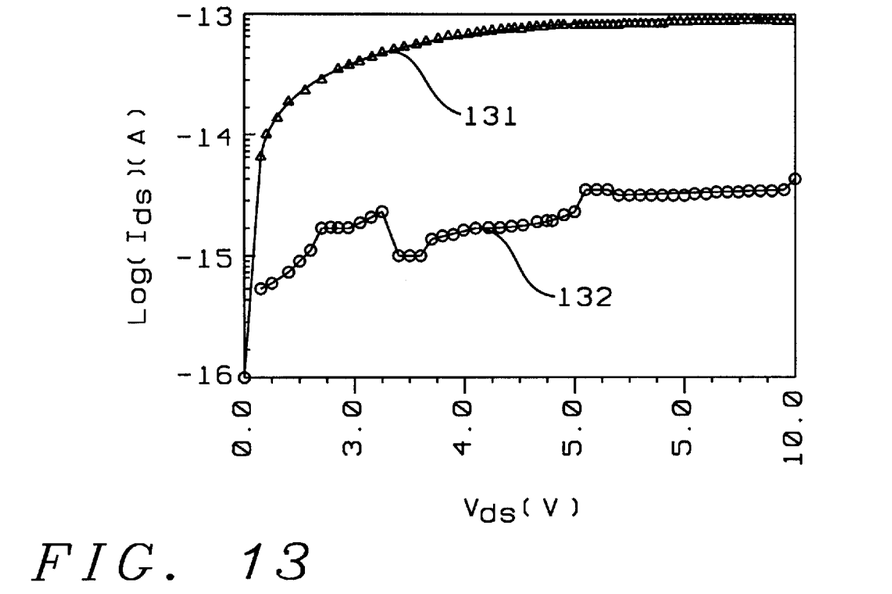

FIG. 13 compares simulated leakage plots for bulk and partial SOI devices. As can be seen, there is a significant reduction in leakage for the partial SOI device.

(b) Thermal Dissipation Characteristics

Full SOI MOSFETs suffer from self-heating effects due to the low thermal conductance of the buried oxide. At high power levels, this leads to the onset of negative output conductance in the saturation region. This behavior is mainly attributed to a reduction in mobility with increasing channel temperature resulting from self heating. Threshold voltage shifts with the increasing temperature, thereby causing a high sub-threshold current in the off state.

Non-isothermal simulations were carried out to study any variations in the performance of the device due to increase in its internal temperature caused by self heating. The results confirmed that temperature increases due to self-heating in partial SOI structure is much lower than that in a conventional SOI structure. The highest temperature in a partial SOI structure was 67° C., a decease of 65% relative to a normal SOI structure.

(c) Breakdown

One of the major obstacles facing full SOI MOSFETs is the low drain breakdown voltages that the N-channel devices suffer from this premature breakdown in full SOI MOSFETs is due to punch-through or to a parasitic bipolar transistor which is triggered by the impact ionization charging of the film body. The problem does not arise in the partial SOI devices.

(d) Kink effect

Figure 14:
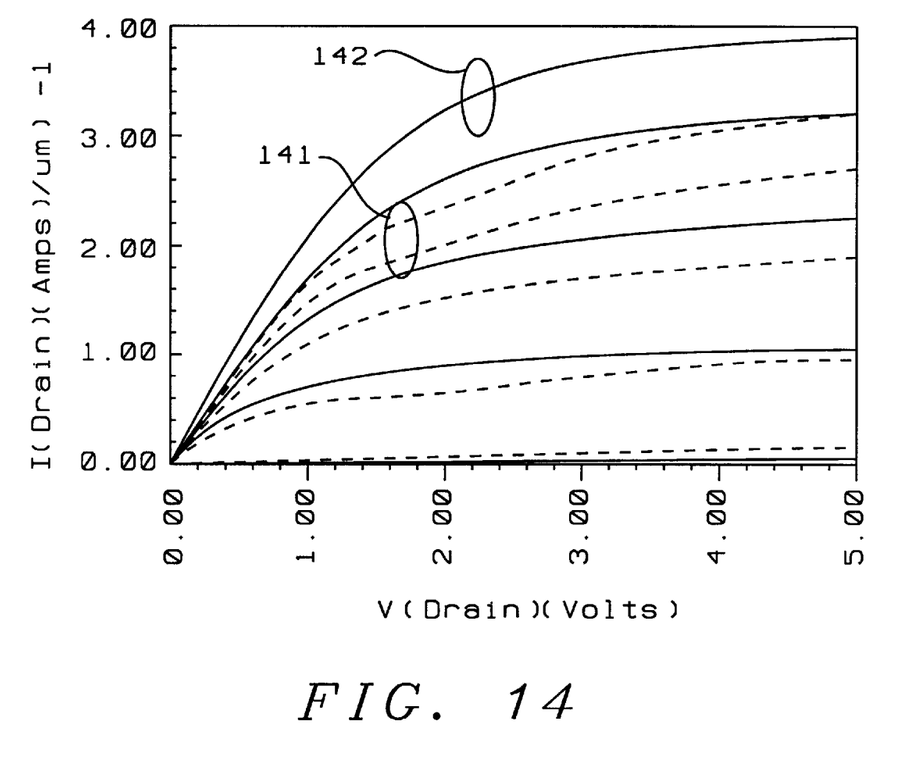

The kink seen in the saturation-region $I_{ds}$–$V_{ds}$ characteristics of floating-body SOI MOSFET's is a result of the decease in the threshold voltage $V_{th}$ caused by forward-biasing of the source-body junction. Impact ionization in the high-drain-field region injects holes into the floating body, and the concomitant stored charge induces the forward bias. The kink effect is one of the main floating body effects that are triggered by impact ionization charging of the film body. This leads to an excess drain current in saturation. FIG. 14 shows the simulated $I_{ds}$–$V_{ds}$ characteristics of fully SOL (curves 141) and partial SOI devices (curves 142), an obvious kink effect In fully SOI device being indicates.

What is claimed is:

1. A process for forming a buried oxide layer, comprising:
   providing a silicon body having an upper surface and forming thereon a first layer of silicon oxide;
   on said first layer of silicon oxide depositing a first layer of silicon nitride;
   on said first layer of silicon nitride depositing a second layer of silicon oxide; patterning said second layer of silicon oxide to define at least two trenches and then, using said patterned second layer of silicon oxide as a hand mask, etching said layer of silicon nitride, said first layer of silicon oxide, and said silicon body to a first depth below said upper surface, thereby forming at (east two first trenches;
   depositing on all exposed surfaces a two-layer laminate that further comprises a third layer of silicon oxide on a second layer of silicon nitride;
   selectively removing said two-layer laminate from all horizontal surfaces;
   using said patterned second layer of silicon oxide and said two-layer laminate as a hard mask, fetching said silicon body to a second depth below said upper surface, thereby forming at least two second trenches having sidewalls;
   thermally oxidizing all exposed silicon surfaces until oxide layers growing both inwards and outwards from said sidewalls meet, thereby forming a continuous layer of silicon oxide below said first trenches and parallel to said upper surface;
   removing said two layer laminate;
   then overfilling said first trenches with polysilicon;
   using said patterned second layer of silicon oxide as a hard mask, using a planarizing etch to remove all polysilicon that is on said hard mask and then overetching until said polysilicon and said upper surface are co-planar; and
   then removing said hard mask.

2. The process described in claim 1 wherein said first layer of silicon oxide is formed to a thickness between about 0.3 and 0.7 microns.

3. The process described in claim 1 wherein said first layer of silicon nitride is formed to a thickness between about 0.1 and 0.2 microns.

4. The process described in claim 1 wherein said second layer of silicon oxide is TEOX formed to a thickness between about 0.3 and 0.7 microns.

5. The process described in claim 1 wherein each trench has a width between about 0.3 and 1.5 microns.

6. The process described in claim 1 wherein said first depth is between about 0.3 and 1.5 microns.

7. The process described in claim 1 wherein said second depth is between about 0.5 and 15 microns.

8. The process described in claim 1 wherein said trenches are separated from one another by a distance that is about 1.1 times their width.

9. The process described in claim 1 wherein said third layer of silicon oxide is between about 0.01 and 0.02 microns thick and said second layer of silicon nitride is between about 0.01 and 0.03 microns thick, whereby said two-layer laminate is between about 0.02 and 0.05 microns thick.

10. The process described in claim 1 wherein the step of using a planarizing etch further comprises use of RIE etch-back.

11. The process described in claim 1 further comprising formation of an inductive device directly over the buried oxide layer whereby eddy current losses associated with said inductive device are minimized.

12. The process described in claim 1 further comprising formation of a transmission line directly aver the buried oxide layer whereby capacitive losses associated with said transmission line are minimized.

13. The process described in claim 1 wherein the step of etching the second trenches further comprises using a mix of $C_4F_8$ and $SF_5$ in an ICP RIE system at a pressure of about 15 mtorr, an ICP coil power of about 800 W, bias power of about 15 W, a $C_4F_8$ flow rate of about 90 SCCM, and a $SF_6$ flow rate of about 40 SCCM.

14. The process described in claim 1 wherein the buried oxide layer has a thickness between about 0.5 and 16 microns.

15. A process for manufacturing a field effect transistor, comprising:

providing a body of P+ silicon having left and right edges;

on the P+ silicon body, epitaxially depositing a layer of P− silicon, having an upper surface, and forming thereon a first layer of silicon oxide;

on said first layer of silicon oxide depositing a first layer of silicon nitride;

on said fast layer of silicon nitride depositing a second layer of silicon oxide;

patterning said second layer of silicon oxide to define a plurality of trenches that extend away from the right edge by a first amount and then, using said patterned second layer of silicon oxide as a hard mask, etching said layer of silicon nitride, said first layer of silicon oxide, and said P− silicon body to a first depth below said upper surface, thereby forming said plurality of trenches;

depositing on all exposed surfaces a two-layer laminate that further comprises a third layer of silicon oxide on a second layer of silicon nitride;

selectively removing said two-layer laminate from all horizontal surfaces;

using said patterned second layer of silicon oxide and said two-layer laminate as a hard mask, further etching said silicon body to a second depth below said upper surface, thereby forming a plurality of trenches, each having sidewalls;

thermally oxidizing all exposed silicon surfaces until oxide layers growing both inwards and outwards from said sidewalk meet, thereby forming a continuous layer of silicon oxide below said first trenches and parallel to said upper surface;

removing said two layer laminate;

then overfilling said first trenches with polysilicon;

using said patterned second layer of silicon oxide as a hard mask, using a planarizing etch to remove all polysilicon that is on said hard mask and then overetching until said polysilicon and said upper surface are co-planar;

then removing said hard mask;

then forming a sinker of P+ silicon that attends away from the left edge by a second amount and downwards from said upper surface into the P+ body;

forming a layer of N-silicon, having a thickness less than said depth, that extends away from the right edge by a third amount;

through a mask, forming first and second areas of a layer of N+ silicon that has a thickness greater than said depth, the first area extending away from the right edge for a first width that is less than said third amount and the second area being adjacent to, and extending away from, the sinker for a second width whereby a gap is left between the first and second N+ areas;

forming a layer of gate oxide over said gap and depositing a gate electrode over the gate oxide;

forming a layer of a conductive material on said upper surface that contacts both the P+ sinker and the source region; and forming a drain electrode over the second N+ drain region.

16. The process described in claim 15 wherein each trench has a width between about 0.3 and 1.5 microns.

17. The process described in claim 15 wherein said first depth is between about 4.3 and 1.5 microns and said second depth is between about 0.5 and 15 microns.

18. The process described in claim 15 wherein said trenches are separated from one another by a distance that is about 1.1 times said width.

19. The process described in claim 15 wherein said continuous layer of buried silicon oxide has a thickness between about 0.5 and 16 microns.

20. The process described in claim 15 wherein said field effect transistor has a cutoff frequency greater than about 10 Ghz.

21. The process described in claim 15 wherein said field effect transistor has a thermal dissipation capability such that it can operate at a power level between about 0.5 and 60 watts.

* * * * *